(12) United States Patent  
Breitwisch et al.

(10) Patent No.: US 8,471,236 B2
(45) Date of Patent: Jun. 25, 2013

(54) FLAT LOWER BOTTOM ELECTRODE FOR PHASE CHANGE MEMORY CELL

(75) Inventors: Matthew J. Breitwisch, Yorktown Heights, NY (US); Eric A. Joseph, White Plains, NY (US); Chung H. Lam, Peekskill, NY (US); Hsiang-Lan Lung, Hsin-chu (TW); Alejandro G. Schrott, New York, NY (US)

(73) Assignees: International Business Machines Corporation, Armonk, NY (US); Macronix International Co., Ltd. (TW)

( * ) Notice: Subject to any disclaimer, the term of this patent is extended or adjusted under 35 U.S.C. 154(b) by 0 days.

(21) Appl. No.: 13/550,091

(22) Filed: Jul. 16, 2012

(65) Prior Publication Data

US 2012/0280197 A1 Nov. 8, 2012

Related U.S. Application Data

(62) Division of application No. 12/550,048, filed on Aug. 28, 2009, now Pat. No. 8,283,650.

(51) Int. Cl.
*H01L 29/40* (2006.01)

(52) U.S. Cl.
USPC ...... 257/4; 257/5; 257/E21.586; 257/E29.111

(58) Field of Classification Search
USPC ............................ 257/E21.586, 4, 5, E29.111
See application file for complete search history.

(56) References Cited

U.S. PATENT DOCUMENTS

| 5,118,299 A | 6/1992 | Burns et al. |
| 5,687,112 A | 11/1997 | Ovshinsky |
| 5,789,277 A | 8/1998 | Zahorik et al. |
| 5,825,046 A | 10/1998 | Czubatyj et al. |
| 5,903,059 A | 5/1999 | Bertin et al. |
| 5,956,575 A | 9/1999 | Bertin et al. |
| 6,087,674 A | 7/2000 | Ovshinsky et al. |
| 6,150,253 A | 11/2000 | Doan et al. |
| 6,177,329 B1 | 1/2001 | Pang |
| 6,393,685 B1 | 5/2002 | Collins |

(Continued)

FOREIGN PATENT DOCUMENTS

| EP | 1830362 A2 | 9/2007 |
| WO | 2009115995 A1 | 9/2009 |

OTHER PUBLICATIONS

U.S. Appl. No. 13/102,550; First Office Action; Date Filed: May 6, 2011; Date Mailed: Sep. 17, 2012; pp. 1-37.

(Continued)

*Primary Examiner* — Zandra Smith
*Assistant Examiner* — Paul Patton
(74) *Attorney, Agent, or Firm* — Cantor Colburn LLP; Vazken Alexanian

(57) ABSTRACT

A phase change memory cell having a flat lower bottom electrode and a method for fabricating the same. The method includes forming a dielectric layer over a substrate including an array of conductive contacts, patterning, a via having a low aspect ratio such that a depth of the via is less than a width thereof, to a contact surface of the substrate corresponding to each of the array of conductive contacts to be connected to access circuitry, etching the dielectric layer and depositing electrode material over the etched dielectric layer and within each via, and planarizing the electrode material to form a plurality of lower bottom electrodes on each of the conductive contacts.

9 Claims, 25 Drawing Sheets

U.S. PATENT DOCUMENTS

| | | | |
|---|---|---|---|
| 6,512,241 B1 | 1/2003 | Lai | |
| 6,744,088 B1 | 6/2004 | Dennison | |
| 6,750,469 B2 | 6/2004 | Ichihara et al. | |
| 6,791,102 B2 | 9/2004 | Johnson et al. | |
| 6,797,612 B2 | 9/2004 | Zahorik | |
| 7,026,213 B1 | 4/2006 | Lee | |
| 7,057,923 B2 | 6/2006 | Furkay et al. | |
| 7,224,068 B2 | 5/2007 | Tseng et al. | |
| 7,324,365 B2 | 1/2008 | Gruening-von Schwerin et al. | |
| 7,362,608 B2 | 4/2008 | Schwerin et al. | |
| 7,394,088 B2 | 7/2008 | Lung | |
| 7,397,060 B2 | 7/2008 | Lung | |
| 7,423,300 B2 | 9/2008 | Lung et al. | |
| 7,473,576 B2 * | 1/2009 | Lung | 438/102 |
| 7,476,587 B2 | 1/2009 | Lung | |
| 7,485,487 B1 | 2/2009 | Breitwisch et al. | |
| 7,545,668 B2 | 6/2009 | Philipp et al. | |
| 7,547,913 B2 | 6/2009 | Yoon et al. | |
| 7,560,721 B1 | 7/2009 | Breitwisch et al. | |
| 7,582,889 B2 * | 9/2009 | Asano | 257/4 |
| 7,718,464 B2 | 5/2010 | Zaidi | |
| 7,808,816 B2 | 10/2010 | Tanaka et al. | |
| 7,863,593 B2 | 1/2011 | Happ et al. | |
| 7,879,645 B2 | 2/2011 | Lung et al. | |
| 7,927,911 B2 | 4/2011 | Breitwisch et al. | |
| 8,012,790 B2 | 9/2011 | Breitwisch et al. | |
| 8,030,130 B2 | 10/2011 | Breitwisch et al. | |
| 8,189,372 B2 | 5/2012 | Breitwisch et al. | |
| 2001/0032702 A1 | 10/2001 | Feldman et al. | |
| 2002/0023581 A1 | 2/2002 | Vodakov et al. | |
| 2004/0077123 A1 | 4/2004 | Lee et al. | |
| 2004/0179394 A1 | 9/2004 | Ovshinsky et al. | |
| 2004/0195604 A1 | 10/2004 | Hwang et al. | |
| 2005/0180191 A1 | 8/2005 | Xu | |
| 2005/0263829 A1 * | 12/2005 | Song et al. | 257/379 |
| 2006/0175597 A1 | 8/2006 | Happ | |
| 2006/0175599 A1 | 8/2006 | Happ | |
| 2007/0010082 A1 | 1/2007 | Pinnow et al. | |
| 2007/0018202 A1 | 1/2007 | Zhu | |
| 2007/0029606 A1 | 2/2007 | Noh et al. | |
| 2007/0034849 A1 | 2/2007 | Sandoval et al. | |
| 2007/0108488 A1 | 5/2007 | Suh et al. | |
| 2007/0155117 A1 | 7/2007 | Wicker | |
| 2007/0158395 A1 | 7/2007 | Fasano et al. | |
| 2007/0166981 A1 | 7/2007 | Furukawa et al. | |
| 2007/0184233 A1 | 8/2007 | Meinders et al. | |
| 2007/0197012 A1 | 8/2007 | Yang et al. | |
| 2007/0246440 A1 | 10/2007 | Sato | |
| 2007/0246782 A1 | 10/2007 | Philipp et al. | |
| 2007/0249086 A1 | 10/2007 | Philipp et al. | |
| 2007/0252127 A1 | 11/2007 | Arnold et al. | |
| 2008/0023685 A1 | 1/2008 | Czubatyj et al. | |
| 2008/0061341 A1 | 3/2008 | Lung | |
| 2008/0137400 A1 | 6/2008 | Chen et al. | |
| 2008/0138931 A1 | 6/2008 | Lung | |
| 2008/0164452 A1 | 7/2008 | Joseph et al. | |
| 2008/0178436 A1 | 7/2008 | Zhang et al. | |
| 2008/0191187 A1 * | 8/2008 | Lung et al. | 257/4 |
| 2008/0197333 A1 | 8/2008 | Lung | |
| 2008/0203379 A1 | 8/2008 | Magistretti et al. | |
| 2008/0246014 A1 | 10/2008 | Lung | |
| 2008/0265234 A1 | 10/2008 | Breitwisch et al. | |
| 2008/0265239 A1 | 10/2008 | Philipp et al. | |
| 2008/0286446 A1 | 11/2008 | Kamepalli et al. | |
| 2008/0316794 A1 | 12/2008 | Philipp et al. | |
| 2009/0072216 A1 | 3/2009 | Lung et al. | |
| 2009/0149006 A1 | 6/2009 | Kim | |
| 2009/0185411 A1 | 7/2009 | Happ et al. | |
| 2009/0196094 A1 | 8/2009 | Breitwisch et al. | |
| 2009/0242865 A1 | 10/2009 | Lung et al. | |
| 2011/0049460 A1 | 3/2011 | Breitwisch et al. | |

OTHER PUBLICATIONS

Y.C. Chen et al.; "Ultra-Thin Phase-Change Bridge Memory Device Using GeSb;" Electron Device Meeting 2006; pp. 1-3.

Notification of Transmittal of the International Search Report and the Written Opinion of the International Searching Authority, or the Declaration; date of mailing Jan. 10, 2011; PCT/US2010/056174.

International Search Report; International Application No. PCT/EP2010/066131; International Filing Date: Oct. 26, 2010; Date of Mailing: Jan. 19, 2011.

International Search Report—Written Opinion; International Application No. PCT/EP2010/066131; International Filing Date: Oct. 26, 2010; Date of Mailing: Jan. 19, 2011.

Y.N. Hwang et al., "Phase-Change Chalcogenide Nonvolatile RAM Completely Based on CMOS Technology," 2003 International Symposium on VLSI Technology, Systems, and Applicatons (IEEE), Oct. 6-8, 2003. pp. 29-31.

M. Breitwisch et al., "Novel Lithography-Independent Pore Phase Change Memory," IEEE Symposium on VLSI Technology, 2007, pp. 1-2.

Der-Sheng Chao et al., "Low Programming Current Phase Change Memory Cell with Double GST Thermally Confined Structure", VLSI Technology, 2006, Systems and Applications, 2007, VLSI-TSA 2007, International Symposium on; Apr. 23-25, 2007 pp. 1-2.

U.S. Appl. No. 13/004,471; Non-Final Office Action; Date Filed: Jan. 11, 2011; Date Mailed: Jun. 8, 2012; pp. 1-21.

B. Rajendran et al., "On the Dynamic Resistance and Reliability of Phase Change Memory," Symposium on VLSI Technology; 2008, pp. 1-2.

S. Raoux et al., "Phase-change random access memory: A scalable technology", IBM J Res. & Dev. vol. 52. 4/5 Jul./Sep. 2008 pp. 465-479.

Song, Y.J. et al, "Advanced ring type contact technology for high density phase change memory", Solid-State Device Research Conference, 2005, ESSDERC 2005, Proceedings of 35th European; Sep. 12-16, 2005 pp. 513-516.

Song, Y.J. et al., "Highly Reliable 256Mb PRAM with Advanced Ring Contact Technology and Novel Encapsulating Technology", VLSI Technology, 2006, Digest of Technical Papers, 2006 Symposium on; pp. 118-119.

International Search Report; International Application No. PCT/US10/43631; International Filing Date: Jul. 29, 2010; Date of Mailing: Sep. 23, 2010.

International Search Report—Written Opinion—International Application No. PCT/US10/43631; International Filing Date: Jul. 29, 2010; Date of Mailing: Sep. 23, 2010.

Xiu-Lan Cheng et al., "Simulation on a Novel Ga-doped Phase Change Memory for Next Generation Embedded Non-Volatile Memory Application," 2008 IEEE/SEMI Advanced Semiconductor Manufacturing Conference, pp. 43-48.

* cited by examiner

US 8,471,236 B2

FLAT LOWER BOTTOM ELECTRODE FOR PHASE CHANGE MEMORY CELL

CROSS-REFERENCE TO RELATED APPLICATION

This application is a divisional of U.S. patent application Ser. No. 12/550,048, filed Aug. 28, 2009, now U.S. Pat. No. 8,283,650, the disclosure of which is incorporated by reference herein in its entirety.

BACKGROUND

The present invention relates generally to phase change memory cells and a method for fabricating the same, and more specifically, to a phase change memory cell having a lower bottom electrode formed of a selectable material and a method for fabricating a self-aligned lower bottom electrode which does not require a lithographic masking process, is substantially seam free, and which has minimal topography (i.e., is flat).

A phase change memory cell requires a highly scaled portion of the memory cell to be defined. In order to define a highly controlled sub-lithographically sized aperture within the phase change memory cell, a keyhole transfer method is typically used. FIGS. 1A through 1D illustrate a typical keyhole transfer method. In FIG. 1A, a bottom electrode layer 10 and a memory cell layer 12 on top of the bottom electrode layer 10 are provided. A first dielectric layer 15 is formed on the bottom electrode layer 10 and an isolation layer 16 is formed on the first dielectric layer 15, and a second dielectric layer 17 is formed on the isolation layer 16. A photo resist layer 18 is formed over the second dielectric layer 17. A via 20 is formed to extend to the first dielectric layer 15 using the photo resist layer 18 via a lithography process. In FIG. 1B, the photo resist layer 18 is removed and the isolation layer 16 is recessed, creating overhang portions 17a and 17b of the second dielectric layer 17. In FIG. 1C, a conformal film 22 is deposited within the via 20 and pinched to form a void (i.e., a keyhole structure 24) in a lower region of the via 20. In FIG. 1D, the conformal film 22 is recessed and the keyhole structure 24 is transferred down into the first dielectric layer 15 to form a pore 26.

Currently, uniform keyhole formation and the ability to transfer the keyhole into an underlying layer or to a lower portion of the material which includes the keyhole structure, may depend on the underlying topography of the structure on top of which the keyhole structure is formed. Further, in the phase change memory cell, the electrode material which contacts the phase change material is required to be made of a specific material. The electrical and thermal resistivity of the electrode material as well as the affinity of the electrode material to chemically interact with the phase change material determines the suitability of the electrode material.

SUMMARY

The present invention provides a lower bottom electrode structure of a phase change memory device and method for fabricating the same. The lower bottom electrode is formed of a selectable material on top of which the highly scaled aperture of a phase change element is formed. In addition, the present invention provides a fabrication method for fabricating a self-aligned lower bottom electrode without the use of a lithographic masking operation.

According to one embodiment, a method for fabricating lower bottom electrodes of a phase change memory device is provided. The method includes forming a dielectric layer over a substrate including an array of conductive contacts, patterning, a via having a low aspect ratio such that a depth of the via is less than a width thereof, to a contact surface of the substrate corresponding to each of the array of conductive contacts to be connected to access circuitry, etching the dielectric layer and depositing electrode material over the etched dielectric layer and within each via, and planarizing the electrode material to form a plurality of lower bottom electrodes on each of the conductive contacts.

According to one embodiment of the present invention, a method for fabricating lower bottom electrodes of a phase change memory device is provided. The method includes etching an array of conductive contacts formed in a substrate including a dielectric layer formed thereon, with respect to the dielectric layer to form a plurality of vias corresponding to a contact surface of the conductive contacts, each via having a low aspect ratio such that a depth of the via is less than a width thereof, depositing an electrode material on the dielectric layer and within the plurality of vias, and planarizing the electrode material to form a plurality of lower bottom electrodes self-aligned to the conductive contacts.

According to another embodiment of the present invention, a phase change memory cell is provided. The phase change memory cell includes a substrate including a conductive contact to be connected with access circuitry and a dielectric layer formed on the substrate, a keyhole-defined via formed through the dielectric layer to a contact surface corresponding to the conductive contact to form a lower bottom electrode and a keyhole-defined bottom electrode on the lower bottom electrode. The keyhole-defined bottom electrode and the lower bottom electrode including an electrode material, and the lower bottom electrode having a depth less than a width thereof. The phase change memory cell further includes a phase change layer formed in the dielectric layer and capping an upper surface of the keyhole-defined bottom electrode, and a top electrode formed on the phase change memory cell.

According to another embodiment of the present invention, a phase change memory cell is provided. The phase change memory cell includes a substrate including a conductive contact to be connected with access circuitry and a dielectric layer formed on the substrate, a keyhole-defined via formed through the dielectric layer and the substrate to an etched surface corresponding to the conductive contact to form a lower bottom electrode and a keyhole-defined bottom electrode on the lower bottom electrode. The keyhole-defined bottom electrode and the lower bottom electrode including an electrode material, and the lower bottom electrode being self-aligned to the etched surface of the conductive contact and having a depth less than a width thereof. The phase change memory cell further includes a phase change layer formed in the dielectric layer and capping an upper surface of the keyhole-defined bottom electrode, and a top electrode formed on the phase change memory cell.

According to yet another embodiment of the present invention, a phase change memory-in-via memory cell is provided. The phase change memory-in-via memory cell includes a substrate including a conductive contact to be connected with access circuitry and an insulating layer surrounding the conductive contact, a via formed through the insulating layer to a contact surface of the conductive contact to form a lower bottom electrode including electrode material. The contact surface of the conductive contact is etched with respect to the insulating layer prior to forming the lower bottom electrode such that the lower bottom electrode is self-aligned to the conductive contact and includes a depth less than a width thereof. The phase change memory-in-via memory cell further includes a phase change layer formed in the via and capping an upper surface of the lower bottom electrode, and a top electrode formed on the phase change memory-in-via memory cell.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present invention provides lower bottom electrode structures that are either self-aligned or non-self-aligned to an underlying conductive contact, which can be implemented within various types of phase change memory cell structures. According to an embodiment of the present invention, the lower bottom electrode is formed such that a via patterned to form the lower bottom electrode has a low aspect ratio where the depth of the via is less than the width of the via so that the subsequent deposition of electrode material fills the via without creating a seam in the center of the via, thereby forming a "flat" lower bottom electrode. FIGS. 2 through 5 illustrate several examples of phase change memory cell structures employing a lower bottom electrode structure in accordance with embodiments of the present invention. In FIGS. 2 through 5, the lower bottom electrodes are self-aligned to an underlying conductive contact according to embodiments of the present invention.

Figure 1A:
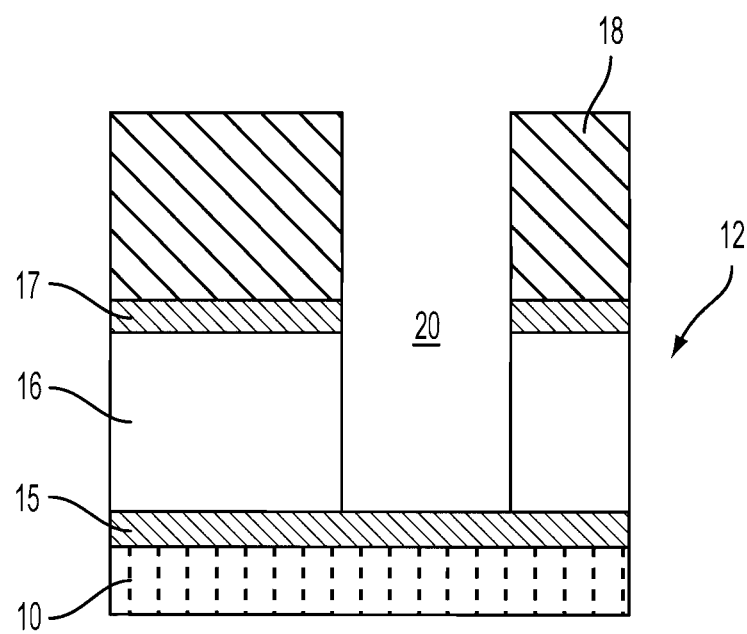
FIGS. 1A through 1D are diagrams illustrating a conventional keyhole transfer method.
Figure 1B:
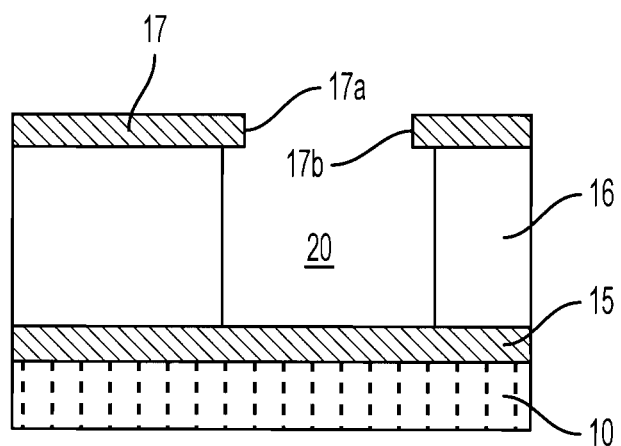
Figure 1C:
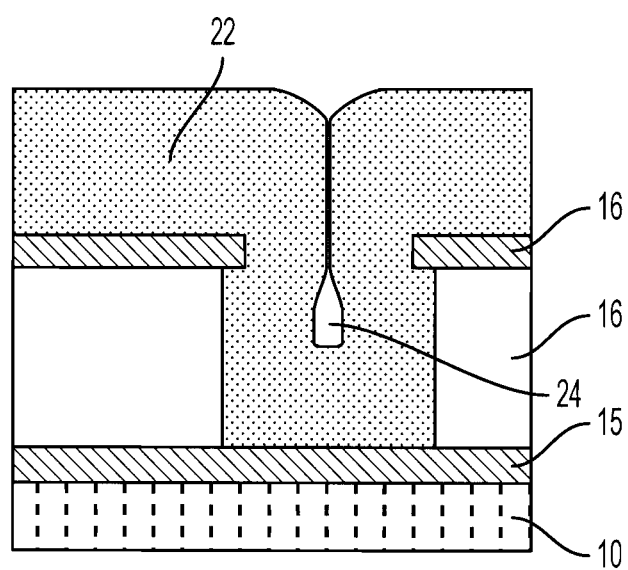
Figure 1D:
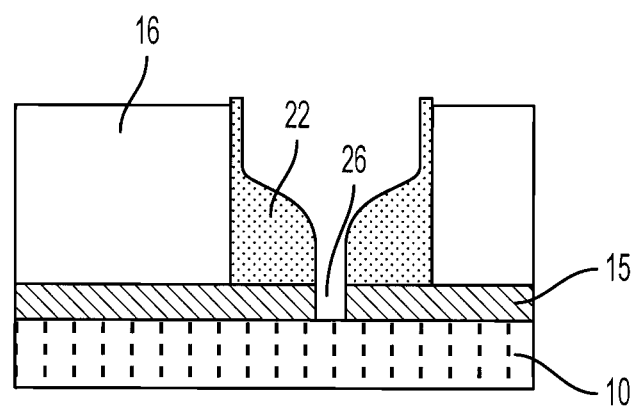
Figure 2:
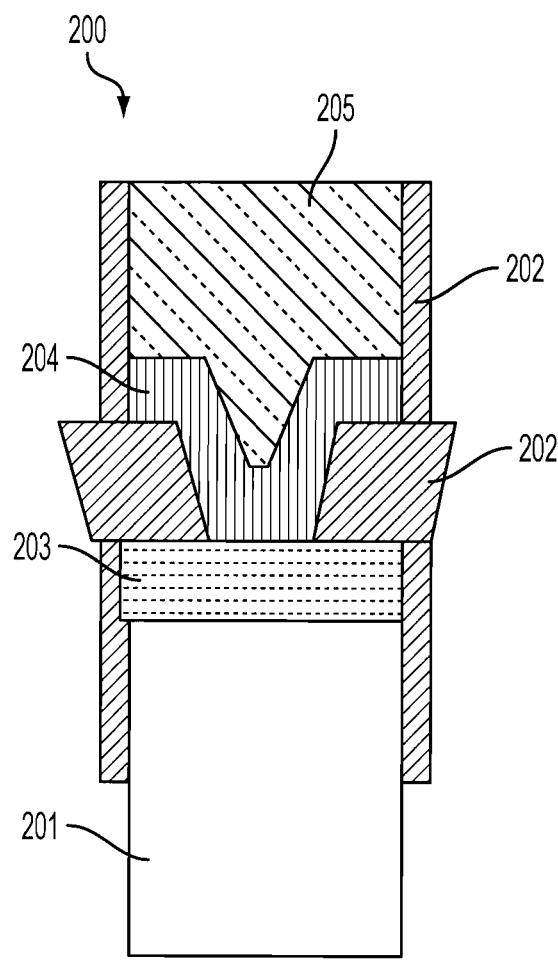
FIG. 2 is a diagram illustrating a vertical phase change memory cell that can be implemented within embodiments of the present invention.

With reference now to FIG. 2, a vertical memory cell structure (i.e., a V-Cell) 200 is provided according to an embodiment of the present invention. The V-Cell 200 is formed on a substrate having a conductive contact 201 formed therein. The substrate may be a borophosphosilicate glass (BPSG) type substrate, however the present invention is not limited hereto and any suitable type of substrate may be utilized for the purpose set forth herein. According to an embodiment of the present invention, the conductive contact 201 comprises tungsten (W) or titanium nitride (TiN) for example. The conductive contact 201 is surrounded by an insulating layer 202 such as silicon nitride (SiN). A lower bottom electrode 203 is formed on an upper surface of the conductive contact 201. According to an embodiment of the present invention, the lower bottom electrode 203 is formed of a selectable material. The selectable material may be titanium nitride (TiN) deposited by a chemical vapor deposition (CVD) operation, however, the present invention is not limited hereto and alternative material may be used. A fabrication method of the lower bottom electrode 203 will be described below with reference to FIG. 7. Alternatively the lower bottom electrode may be non-self-aligned to the underlying conductive contact 201 and fabricated according to the fabrication method shown in FIG. 6 as described below.

Further shown in FIG. 2, phase change material 204 is deposited on the lower bottom electrode 203 and a top electrode 205 is deposited on top of the phase change material 204. According to an embodiment of the present invention, the phase change material 204 may be made of germanium-antimony-telluride (GeSbTe) or one of alloys of gallium (Ga)/Sb, indium (In)/Sb, In/selenium (Se), Sb/Te, Ge/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S). A wide range of alloy compositions may be used.

Figure 3:
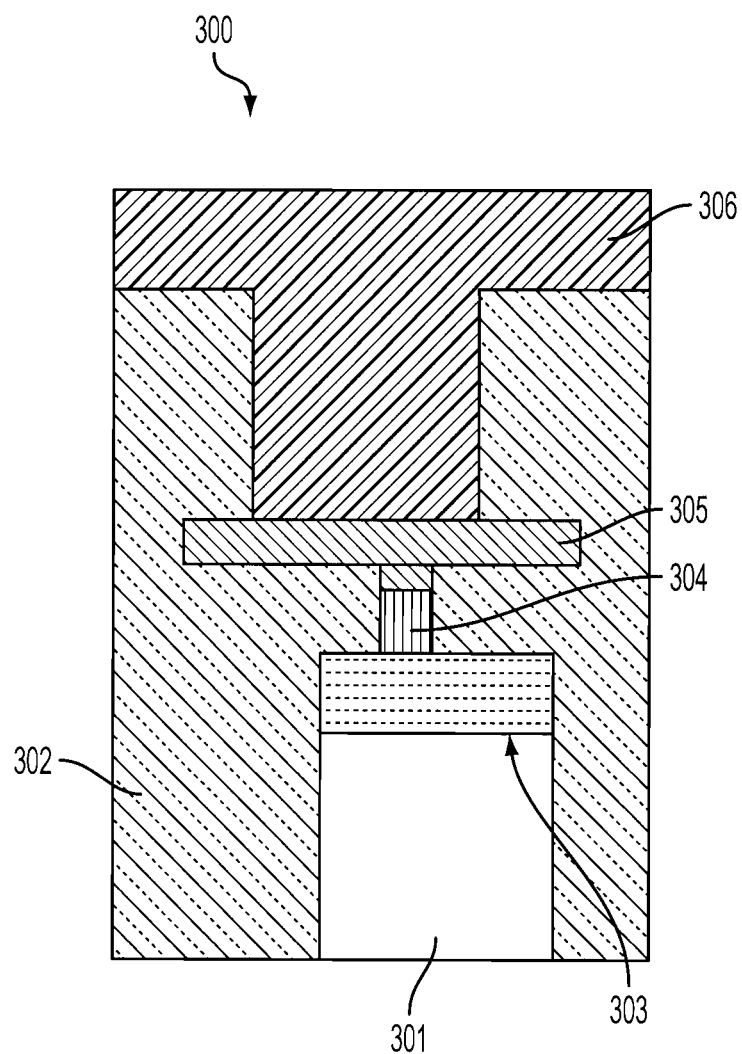
FIG. 3 is a diagram illustrating a pillar memory cell that can be implemented within embodiments of the present invention.

FIG. 3 is a diagram illustrating a pillar memory cell employing the lower bottom electrode that can be implemented within embodiments of the present invention. As shown in FIG. 3, a pillar memory cell 300 is provided. The pillar memory cell 300 is formed on a substrate having a conductive contact 301 formed therein. The conductive contact 301 may be made of tungsten (W) or titanium nitride (TiN). The conductive contact 301 is surrounded by an insulator material 302 such as silicon nitride. A lower bottom electrode 303 is formed on the conductive contact 301. The lower bottom electrode 303 may be made of titanium nitride, for example. However, the present invention is not limited hereto. Phase change material 304 is formed to contact an upper surface of the lower bottom electrode 303. A top electrode 305 is formed on the phase change material 304 and a via-in-line 306 is formed on top of the top electrode 305. The via-in-line layer 306 may be formed of copper (Cu) or tungsten (W), for example, however the present invention is not limited hereto and any suitable material may be used.

Figure 4:
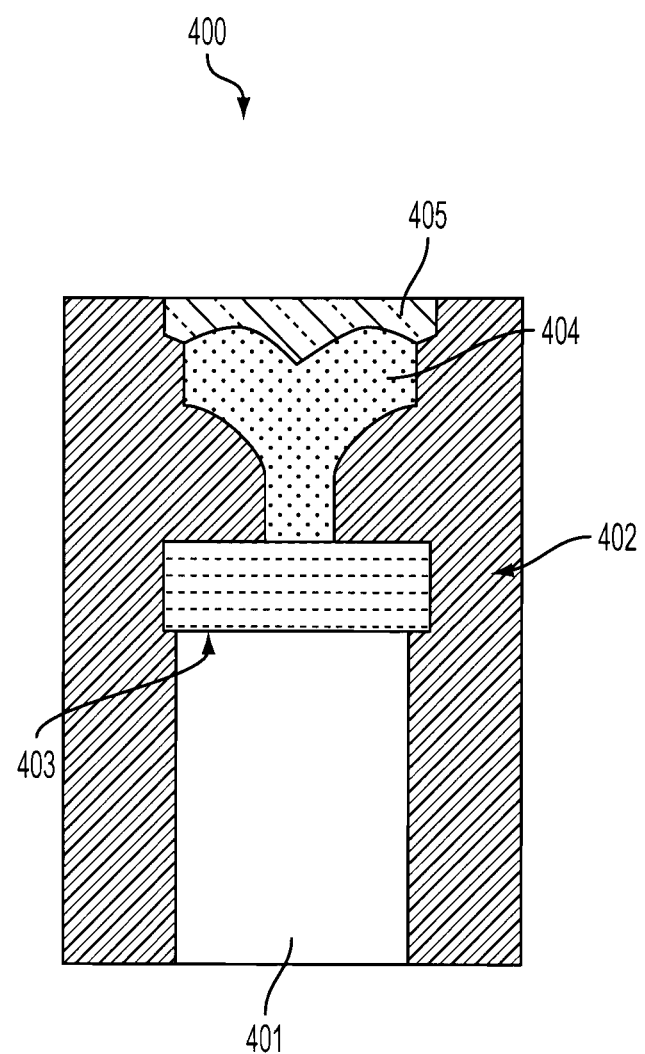
FIG. 4 is a diagram illustrating a memory-in-via memory cell that can be implemented within embodiments of the present invention.

FIG. 4 is a diagram illustrating a memory-in-via memory cell 400 including a lower bottom electrode that can be implemented within embodiments of the present invention. As shown in FIG. 4, the memory-in-via memory cell 400 includes a substrate having a conductive contact 401 to be connected with access circuitry (not shown) and an insulating layer 402 surrounding the conductive contact 401. The conductive contact 401 may be made of tungsten (W) or titanium nitride (TiN), for example. The insulating layer 402 may be made of silicon nitride (SiN), for example. A via is formed through the insulating layer 402 to a contact surface of the conductive contact 401 to form a lower bottom electrode 403 including electrode material. The contact surface of the conductive contact 401 is etched with respect to the insulating layer 402 prior to forming the lower bottom electrode 403 such that the lower bottom electrode 403 is self-aligned to the conductive contact 401. The phase change memory-in-via memory cell 400 further includes phase change material 404 formed in the via and capping an upper surface of the lower bottom electrode 403, and a top electrode 405 formed on the phase change material 404. According to an embodiment of the present invention, the top electrode 405 may be made of titanium nitride (TiN), for example.

Figure 5:
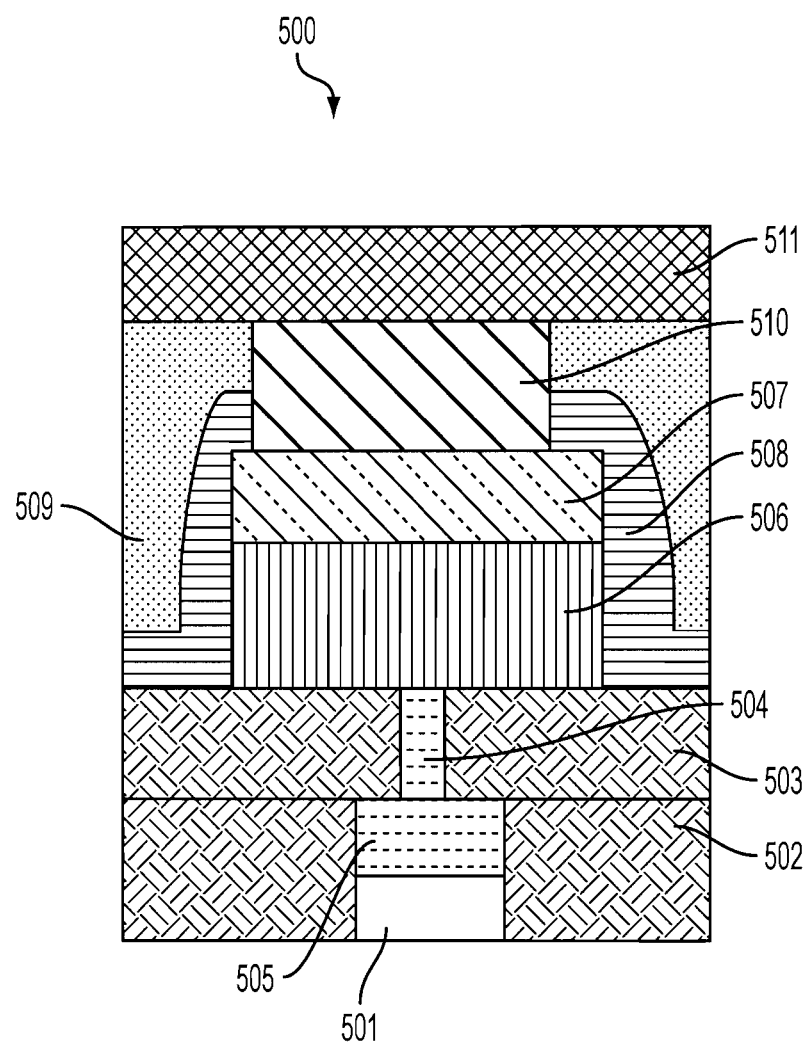
FIG. 5 is a diagram illustrating a mushroom type memory cell that can be implemented within embodiments of the present invention.

FIG. 5 is a diagram illustrating a mushroom type memory cell including a lower bottom electrode that can be implemented within embodiments of the present invention. As shown in FIG. 5, a mushroom-type memory cell 500 includes a substrate 502 having a conductive contact 501 to be connected to access circuitry. The conductive contact 501 may be made of tungsten (W) or titanium nitride (TiN), for example. A dielectric layer 503 is formed on top of the substrate 502. A keyhole-defined via is formed through the dielectric layer 503 in order to form a keyhole-defined bottom electrode 504 on a lower bottom electrode 505. The lower bottom electrode 505 is self-aligned to an etched contact surface of the conductive contact 501 in accordance with the fabrication method shown in FIGS. 7A through 7D. A fabrication process for fabricating a non-self-aligned mushroom-type memory cell will be described below with reference to FIG. 8. Phase change material 506 such as GST is deposited over the keyhole-defined bottom electrode 504 via a physical vapor deposition (PVD) sputtering process, for example, and contacts an upper surface of the keyhole-defined bottom electrode 504. A top electrode 507 is formed on the phase change material 506. The phase change material 506 and the top electrode 507 are surrounded by a cap layer 508 made of silicon nitride, for example. The cap layer 508 protectively seals sides of the phase change material 506 and a top electrode 507. An interdielectric layer 509 is applied and planarized using a chemical mechanical polishing (CMP) process. A top electrode contact via is formed through the interdielectric layer 509 and filled with a contact material to form a top electrode contact 510. According to an embodiment of the present invention, the contact material may be copper (Cu) or tungsten (W). Further, the resulting structure is covered by a metal layer 511 patterned to define a bit line. The metal layer 511 may also be formed of copper (Cu) or tungsten (W), for example.

Figure 6A:
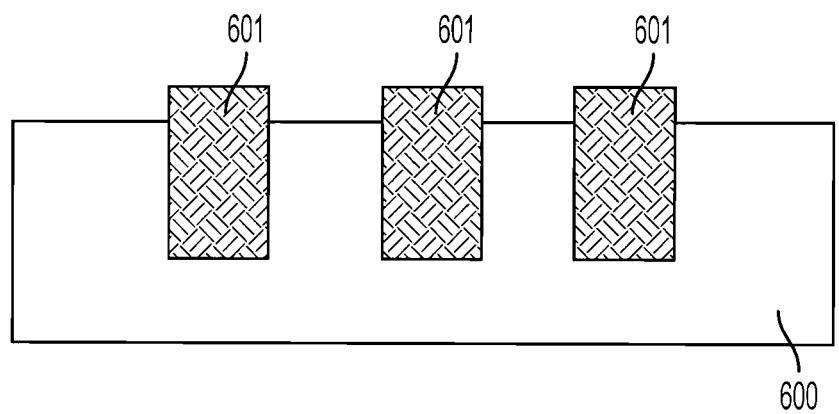
FIGS. 6A through 6F are diagrams illustrating a fabrication method for fabricating a lithography-defined (i.e., non-self-aligned) lower bottom electrode of a phase change memory cell that can be implemented within embodiments of the present invention.
Figure 6B:
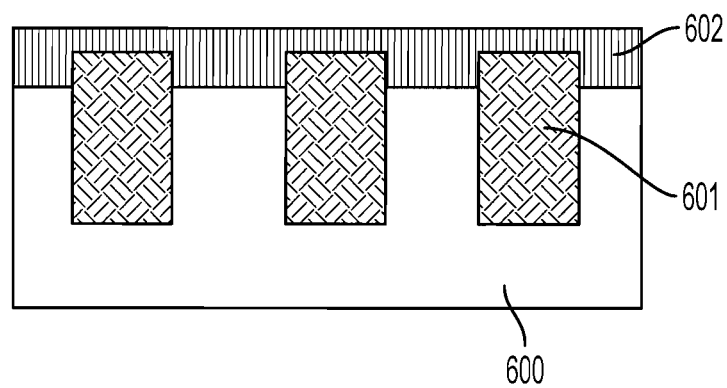
Figure 6C:
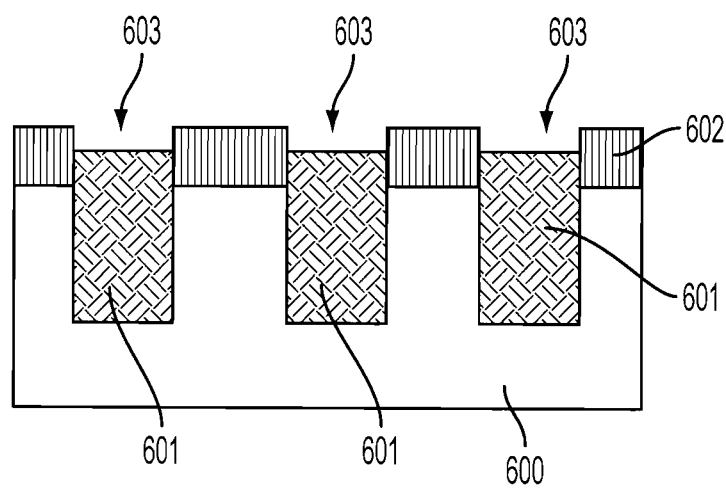
Figure 6D:
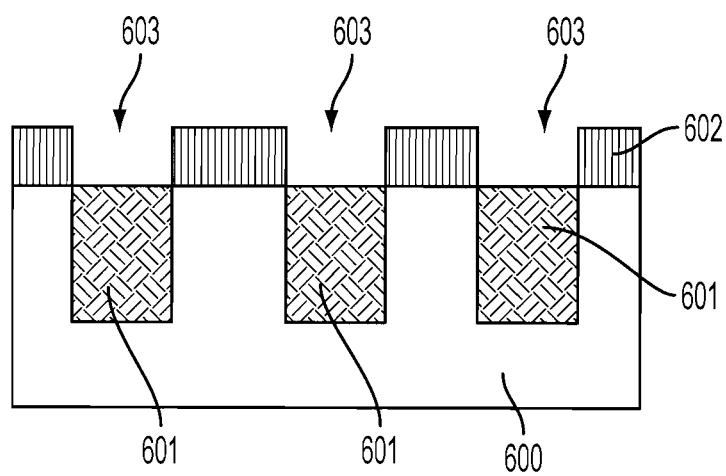
Figure 6E:
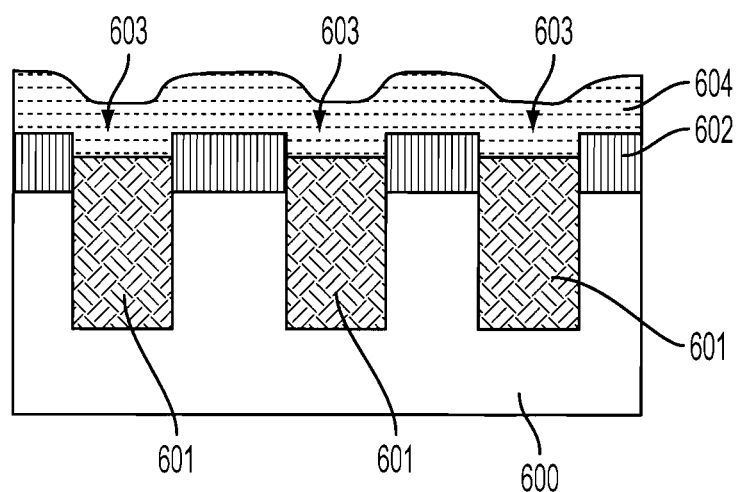
Figure 6F:
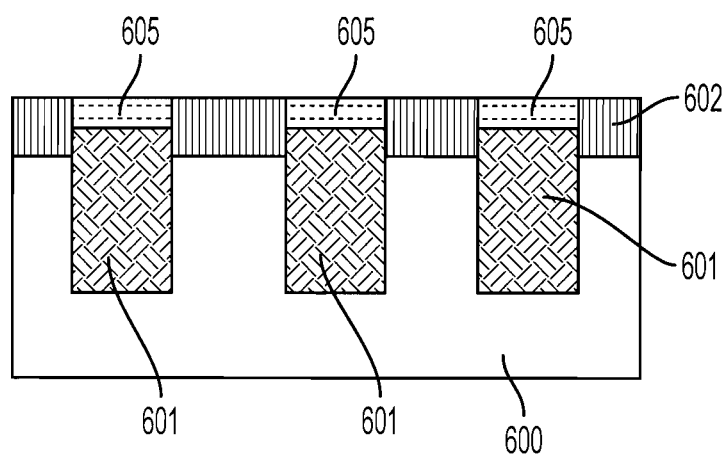

FIGS. 6A through 6F are diagrams illustrating a fabrication method for fabricating a lithography-defined (non-self-aligned) lower bottom electrode of a phase change memory cell that can be implemented within embodiments of the present invention. As shown in FIG. 6A, a substrate, for example a BPSG substrate 600 is provided having a plurality of conductive contacts 601 formed therein. Each conductive contact 601 may be made of tungsten (W), for example. FIG. 6B illustrates the next stage of the fabrication process. As shown in FIG. 6B, a dielectric layer 602 is formed over the conductive contacts 601. The dielectric layer 602 may include silicon nitride (SiN) or silicon dioxide ($SiO_2$), for example. The dielectric layer 602 is then polished via a conventional polishing procedure. According to an embodiment of the present invention, the dielectric layer 602 may be of a thickness of approximately 170 nanometers (nm). FIG. 6C illustrates the next stage of the fabrication process. As shown in FIG. 6C, a plurality of vias 603 are formed through the dielectric layer 602 to an upper contact surface of each conductive contact 602. According to an embodiment of the present invention, the depth of each via 603 is less than the width thereof. Next, in FIG. 6D, the dielectric layer 602 is etched via a reactive ion etching (RIE) process and a diluted hydrofluoric acid (DHF) wet clean process is then performed. In FIG. 6E, electrode material 604 is then deposited on the dielectric layer and within the vias 603. According to an embodiment of the present invention, the electrode material 602 may include titanium nitride (TiN), tungsten (W) or any suitable conductive material. According to one embodiment, approximately 10 nanometers (nm) of ion metal plasma (IMP) titanium (Ti) may be deposited followed by a layer of titanium nitride (TiN) which is deposited via a chemical vapor deposition (CVD) process. In FIG. 6F, the electrode material 604 is then planarized using a chemical mechanical polishing (CMP) process to form a lower, flat bottom electrode 605 over each conductive contact 601. A fabrication method for fabricating a self-aligned bottom electrode will now be described with reference to FIGS. 7A through 7D.

Figure 7A:
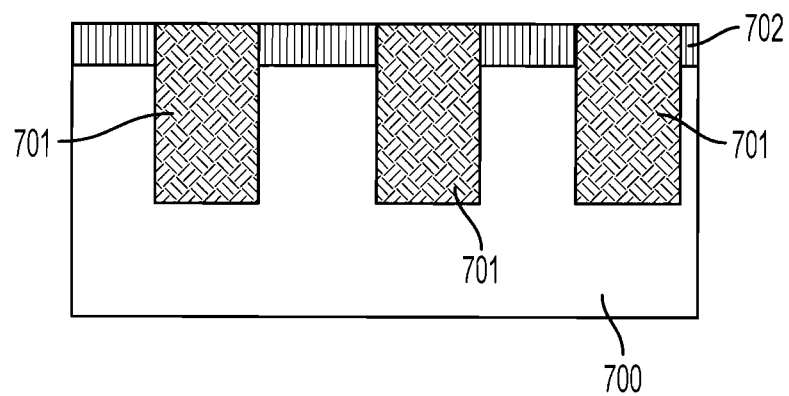
FIGS. 7A through 7D are diagrams illustrating a fabrication method for fabricating a lithography-independent (i.e., self-aligned) lower bottom electrode that can be implemented within alternative embodiments of the present invention.
Figure 7B:
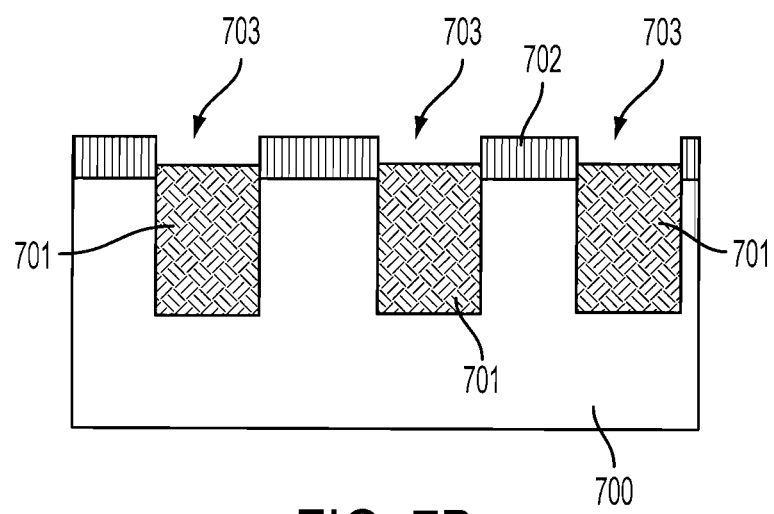
Figure 7C:
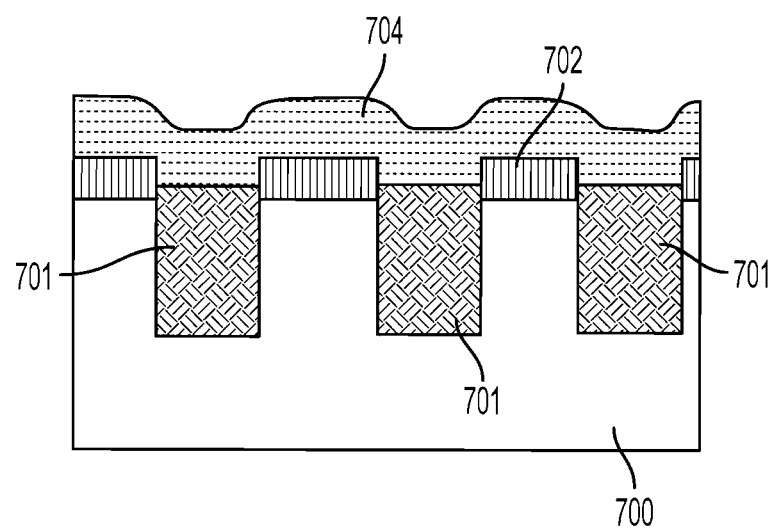
Figure 7D:
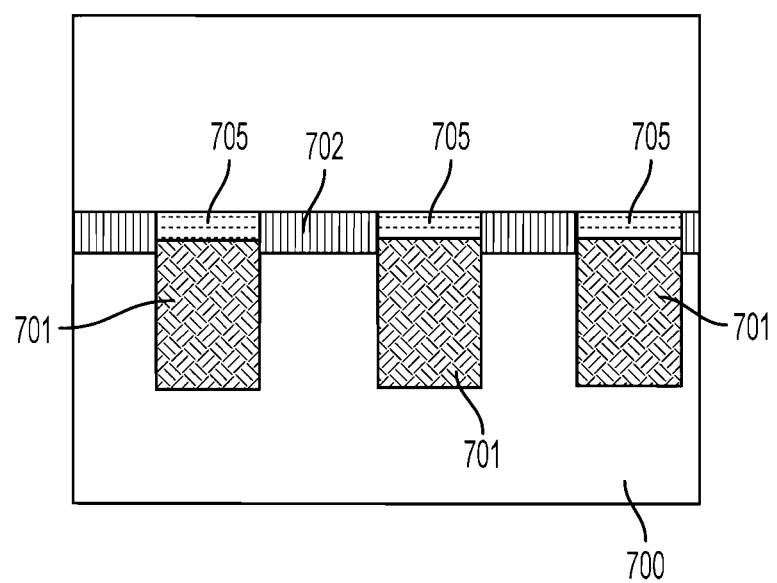

FIGS. 7A through 7D are diagrams illustrating a fabrication method for fabricating a lithography-independent (i.e., self-aligned) lower bottom electrode that can be implemented within alternative embodiments of the present invention. As shown in FIG. 7A, a phase change memory device 700 is shown. A substrate 701 such as a BPSG substrate is provided having a plurality of conductive contacts 701 formed therein and a dielectric layer 702 made of silicon nitride (SiN) for example, formed on the substrate 701. In FIG. 7B, the conductive contacts 701 are recessed with respect to the dielectric layer 702 using a reactive ion etching (RIE) process to form vias 703, for example. According to an embodiment of the present invention, the depth of each via 703 is less than a width thereof. In FIG. 7C, selectable electrode material 704 is then deposited on the dielectric layer 702 and within the vias 703. According to an embodiment of the present invention, the selectable electrode material 704 may include titanium nitride (TiN), tungsten (W), or any suitable conductive material. According to one embodiment, approximately 10 nanometers (nm) of ion metal plasma (IMP) titanium may be deposited followed by a layer of titanium nitride which is deposited via a chemical vapor deposition (CVD) process. In FIG. 7D, the electrode material 704 is then planarized using a chemical mechanical polishing (CMP) process, to form a lower bottom electrode 705 over each conductive contact 701. In one embodiment of the present invention, the dielectric layer 702 acts as a CMP stop layer.

Figure 8A:
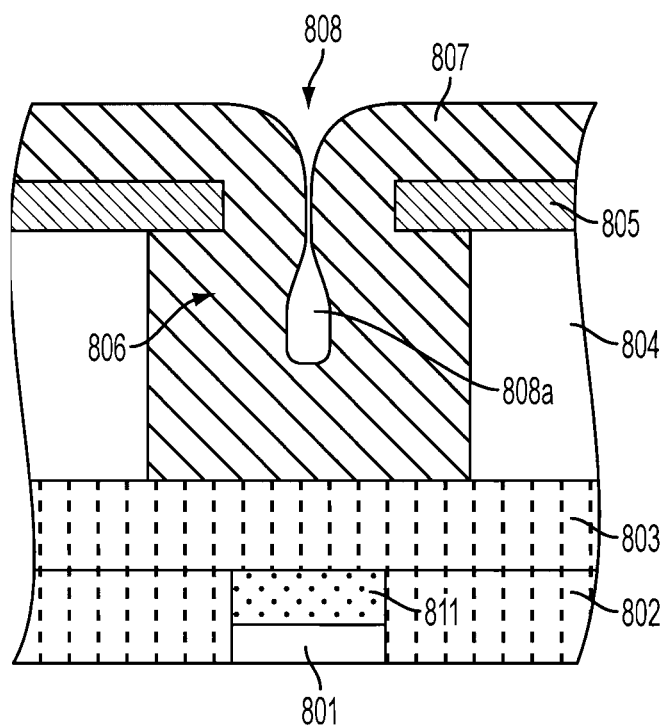
FIGS. 8A through 8F are diagrams illustrating a fabrication method for fabricating a mushroom type memory cell that can be implemented within embodiments of the present invention.

FIG. 8A through 8F are diagrams illustrating a fabrication method for fabricating the mushroom memory cell shown in FIG. 5 that can be implemented within embodiments of the present invention. As shown in FIG. 8A, a keyhole transfer method is used to form a keyhole-defined mushroom cell electrode on a lithography-defined (i.e., non-self aligned) flat lower bottom electrode. As shown, the substrate 802 is provided including the conductive contact 801 to be connected with access circuitry, and a first dielectric layer 803. A flat lower bottom electrode 811 is formed on an upper surface of the conductive contact 801 using the method of fabrication shown in FIGS. 6A through 6F, for example. Alternatively, the flat lower bottom electrode 811 may be formed using the method of fabrication shown in FIGS. 7A through 7D. Next, an isolation layer 804 including silicon dioxide ($SiO_2$), for example is provided on top of the first dielectric layer 803 and a second dielectric layer 805 is provided on top of the isolation layer 804. A via 806 is etched through the second dielectric layer 805 and the isolation layer 804 to expose an upper surface of the first dielectric layer 803. Then, a conformal film 807 is deposited within the via 806 and pinched to form a void (i.e., a keyhole structure 807a) in a lower region of the via 806.

Figure 8B:
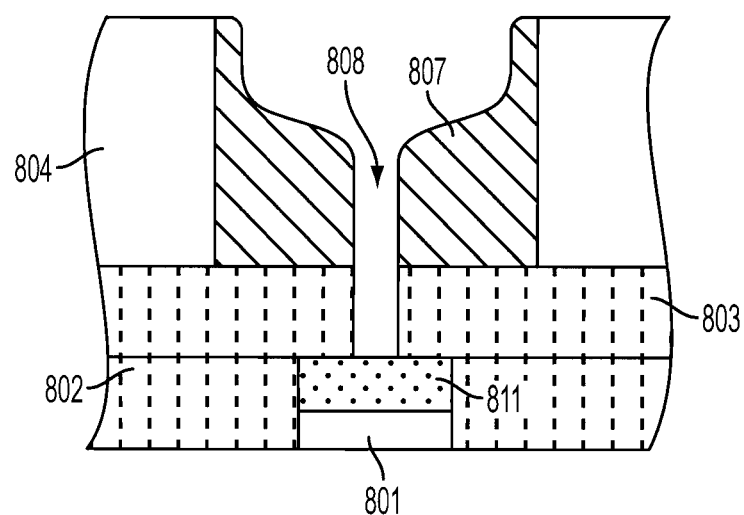
Figure 8C:
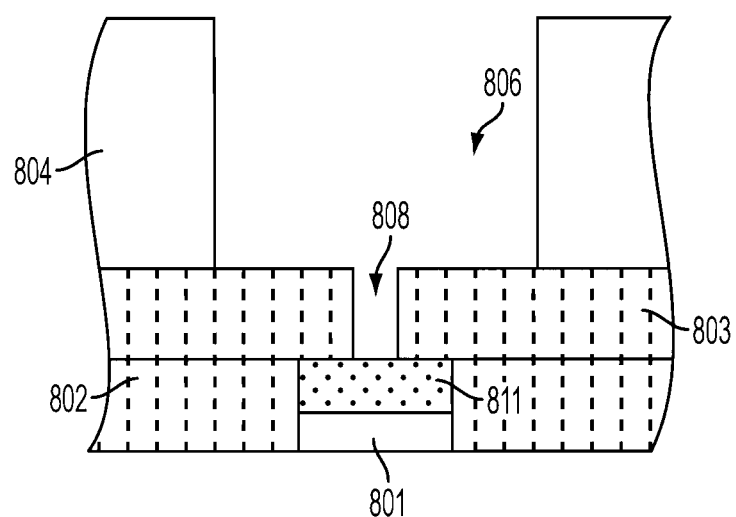
Figure 8D:
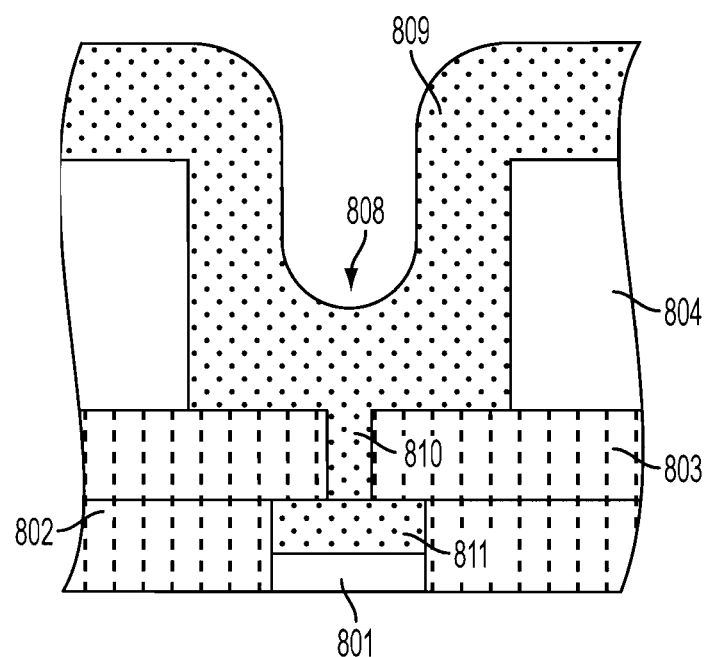
Figure 8E:
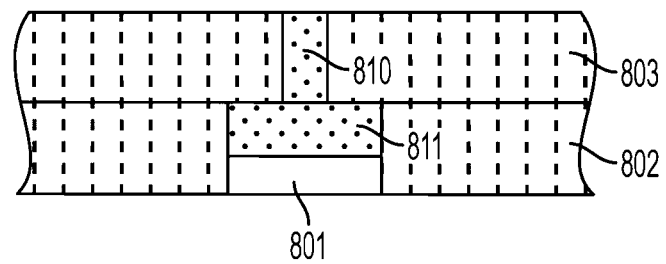
Figure 8F:
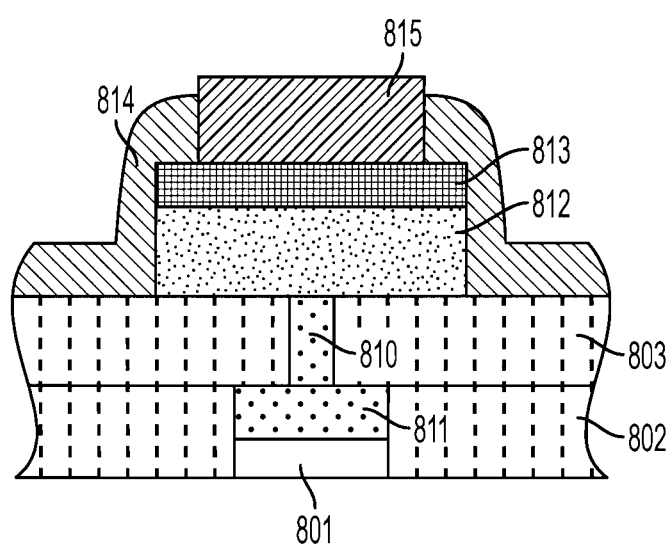

In FIG. 8B, the conformal film 807 is recessed via an anistropic etching process and the keyhole structure 808 is transferred down to the first dielectric layer 803. Then, another etching operation is performed to extend the keyhole structure 808 through the first dielectric layer 803 and into the substrate 802 contacting with an upper surface the flat lower bottom electrode 811 formed on the conductive contact 801 to form a keyhole-defined via 808a. Next, in FIG. 8C, the conformal film 807 is removed by an etching operation such as a wet etching using KOH or TMAH to reopen the via 806. Then, in FIG. 8D, electrode material 809 is deposited in the keyhole-defined via 808a by a CVD operation. Therefore, a keyhole-defined electrode 810 (e.g., the mushroom cell electrode) is formed on top of the flat lower bottom electrode 811. The electrode material 809 may be titanium nitride (TiN), tungsten (W), or any other suitable electrode material as selected. The electrode material 809 fills the keyhole-defined electrode 810. In, FIG. 8E, the keyhole-defined electrode 810 is then polished via a polishing process. In FIG. 8F, the keyhole-defined electrode 810 is capped with phase change material 812. A top electrode 813 is formed on top of the phase change material 812. The top electrode 813 may be of a same be of a same material as used for the bottom electrodes 810 and 811 or may be of a different material closer for its suitability for use with the selected phase change material 812. The top electrode 813 and the phase change material 812 are surrounded by a cap layer 814 to protectively seal the sides thereof.

Next, a top electrode contact 815 is formed on an upper surface of the top electrode 813. According to an embodiment of the present invention, the top electrode contact 815 may be formed of copper (Cu) or tungsten (W), for example.

Figure 9:
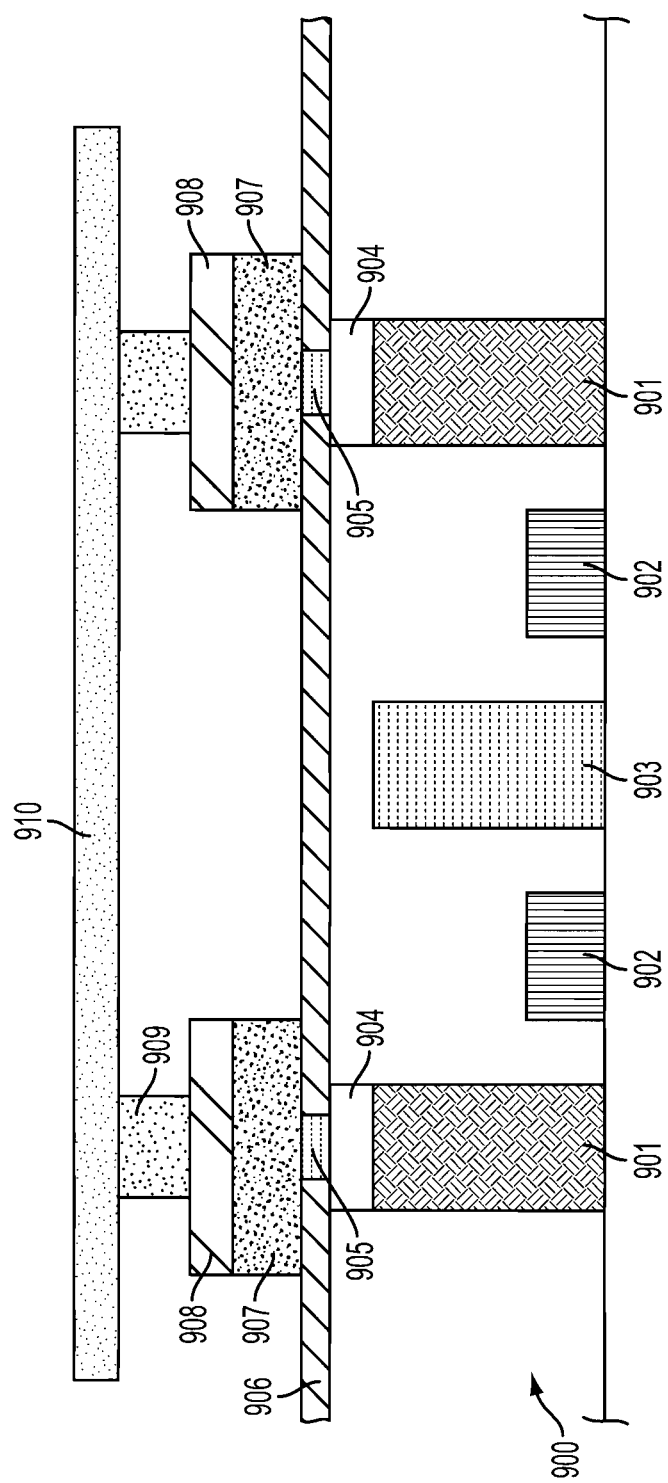
FIG. 9 is a diagram illustrating a phase change memory pore cell that can be implemented within embodiments of the present invention.

FIG. 9 is a diagram illustrating a phase change memory pore cell that can be implemented within embodiments of the present invention. A phase change memory pore cell having a keyhole-defined pore and a lower bottom electrode structure in accordance with an embodiment of the present invention is provided. The phase change memory pore cell includes a substrate 900 having a contact surface with an array of conductive contacts 901 to be connected with access circuitry (not shown). The substrate 900 includes an oxide layer which may be silicon oxide. The access circuitry may include transistors such as complementary metal oxide semiconductor (CMOS) or bipolar junction transistors (BJTs) or diodes. Word lines 903 connecting with gates of access transistors and a common source line 903 contacting a source region of the access transistors are also provided. A lower bottom electrode 904 is formed on top of each respective contact 901. The lower bottom electrode 904 may be fabricated in accordance with the fabrication method shown in FIG. 6 or FIG. 7. A keyhole-defined pore 905 is formed in a dielectric layer 906. The keyhole-defined pore 905 contacts an upper surface of the bottom electrode 904. Phase change material 907 is formed within the pore 905 and contacts an upper surface of the bottom electrode 904. A top electrode 908 is formed on top of the phase change material 907. A top electrode contact 909 is then formed on the top electrode 908 for electrical communication with a bit line 910 formed on top of the top electrode contact 909. According to an embodiment of the present invention, the top electrode may be formed of titanium nitride (TiN), for example. The top electrode 908 may be of a same material as used for the bottom electrode 904 or may be of a different material closer for its suitability for use with the selected phase change material 906.

Embodiments of the present invention provide a phase change memory cell having a lower bottom electrode which may be formed of a selectable material and which may be self-aligned or non-self-aligned to an underlying conductive contact within the phase change memory cell. The present invention provides the advantage of creating a lower bottom electrode without performing a lithographic masking process, and providing a lower bottom electrode with minimal topology, which is the ideal platform on which the keyhole-transfer process can best be realized.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A phase change memory cell comprising:
   a substrate including a conductive contact to be connected with access circuitry and a dielectric layer formed on the substrate;
   a keyhole-defined via formed through the dielectric layer to a contact surface corresponding to the conductive contact to form a lower bottom electrode and a keyhole-defined bottom electrode on the lower bottom electrode, the keyhole-defined bottom electrode and the lower bottom electrode including an electrode material, the electrode material comprising ion metal plasma titanium and a layer of titanium nitride deposited on the ion metal plasma titanium, and the lower bottom electrode having a depth less than a width thereof;
   a phase change layer formed in the dielectric layer and capping an upper surface of the keyhole-defined bottom electrode; and
   a top electrode formed on the phase change memory cell.

2. The phase change memory cell of claim 1, wherein the conductive contact comprises titanium nitride or tungsten.

3. The phase change memory cell of claim 2, wherein the ion metal plasma titanium is approximately 10 nanometers (nm) in thickness.

4. A phase change memory cell comprising:
a substrate including a conductive contact to be connected with access circuitry and a dielectric layer formed on the substrate;
a keyhole-defined via formed through the dielectric layer and the substrate to an etched surface corresponding to the conductive contact to form a lower bottom electrode and a keyhole-defined bottom electrode on the lower bottom electrode, the keyhole-defined bottom electrode and the lower bottom electrode including an electrode material, the electrode material comprising ion metal plasma titanium and a layer of titanium nitride deposited on the ion metal plasma titanium and the lower bottom electrode being self-aligned to the etched surface of the conductive contact and having a depth less than a width thereof;
a phase change layer formed in the dielectric layer and capping an upper surface of the keyhole-defined bottom electrode; and
a top electrode formed on the phase change memory cell.

5. The phase change memory cell of claim 4, wherein the conductive contact comprises titanium nitride or tungsten.

6. The phase change memory cell of claim 4, wherein the ion metal plasma titanium is approximately 10 nanometers (nm) in thickness.

7. A phase change memory-in-via memory cell comprising:
a substrate including a conductive contact to be connected with access circuitry including an insulating layer surrounding the conductive contact;
a via formed through the insulating layer to a contact surface of the conductive contact to form a lower bottom electrode including electrode material, the electrode material comprising ion metal plasma titanium and a layer of titanium nitride deposited on the ion metal plasma titanium, the contact surface of the conductive contact is etched with respect to the insulating layer prior to forming the lower bottom electrode such that the lower bottom electrode is self-aligned to the conductive contact and includes a depth less than a width thereof;
a phase change layer formed in the via and capping an upper surface of the lower bottom electrode; and
a top electrode formed on the phase change memory-in-via memory cell.

8. The phase change memory cell of claim 7, wherein the conductive contact comprises titanium nitride or tungsten.

9. The phase change memory cell of claim 7, wherein the ion metal plasma titanium is approximately 10 nanometers (nm) in thickness.

* * * * *